(12) United States Patent
Manfra et al.

(10) Patent No.: US 7,001,813 B2
(45) Date of Patent: Feb. 21, 2006

(54) LAYERS OF GROUP III-NITRIDE SEMICONDUCTOR MADE BY PROCESSES WITH MULTI-STEP EPITAXIAL GROWTHS

(75) Inventors: Michael James Manfra, Clinton, NJ (US); Nils Guenter Weimann, Chatham, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/349,007

(22) Filed: Jan. 22, 2003

(65) Prior Publication Data

US 2003/0235934 A1    Dec. 25, 2003

Related U.S. Application Data

(62) Division of application No. 10/179,806, filed on Jun. 25, 2002, now Pat. No. 6,699,760.

(51) Int. Cl.
*H01L 21/336* (2006.01)
(52) U.S. Cl. ............... 438/285; 438/478; 438/483; 438/479
(58) Field of Classification Search ........ 438/477–479, 438/483, 285–287; 117/90–93, 102–105, 117/84–86, 80; 257/84–86, 90–93, 102–105
See application file for complete search history.

(56) References Cited

U.S. PATENT DOCUMENTS

| | | | |
|---|---|---|---|
| 6,086,673 A * | 7/2000 | Molnar | 117/90 |
| 6,252,261 B1 * | 6/2001 | Usui et al. | 257/190 |
| 2002/0086534 A1 | 7/2002 | Cuomo et al. | 438/689 |

OTHER PUBLICATIONS

Lee et al., "MBE Growth of Wurtzite GaN on LaAIO/(100) substrate", Journal of Crystal Growth, vol. 213, No. 1-2, pp. 33-39, May 2000.*
Lee et al., "MBE Growth of Wurtzite GaN on LaAIO/100 substrate", Journal of Crystal Growth, vol. 213, No. 1,2,pp. 33-39, May 2000.*
E.J. Miller et al., "Reduction of reverse-bias leakage current in Schottky diodes on GaN grown by molecular-beam epitaxy using surface modification with an atomic force microscope", Journal of Applied Physics, vol. 91, No. 12, Jun. 15, 2002, pp. 9821-9826.
E.J. Miller et al., "Reverse-bias leakage current reduction in GaN Schottky diodes by surface modification with an atomic force microscope," Abstract from Technical Program Session V of Electronic Materials Conference, Santa Barbara, CA (Jun. 25-27, 2002) 1 page (Note: may have been published before Jun. 25, 2002).
E.J. Miller et al., "Characterization and Local Passivation of Reverse-Bias Current Leakage Paths in an AIGaN/GaN Heterostructure, Abstract from Nov. 2001 MRS Fall Meeting," Symposium 1, Session 110.7 (1 page), publ.'d online at www.mrs.org/meetings/fall_2001/.

* cited by examiner

*Primary Examiner*—Michael Lebentritt
*Assistant Examiner*—Yennhu B. Huynh
(74) *Attorney, Agent, or Firm*—John F. McCabe

(57) ABSTRACT

One method includes epitaxially growing a layer of group III-nitride semiconductor under growth conditions that cause a growth surface to be rough. The method also includes performing an epitaxial growth of a second layer of group III-nitride semiconductor on the first layer under growth conditions that cause the growth surface to become smooth. The two-step growth produces a lower density of threading defects.

12 Claims, 11 Drawing Sheets

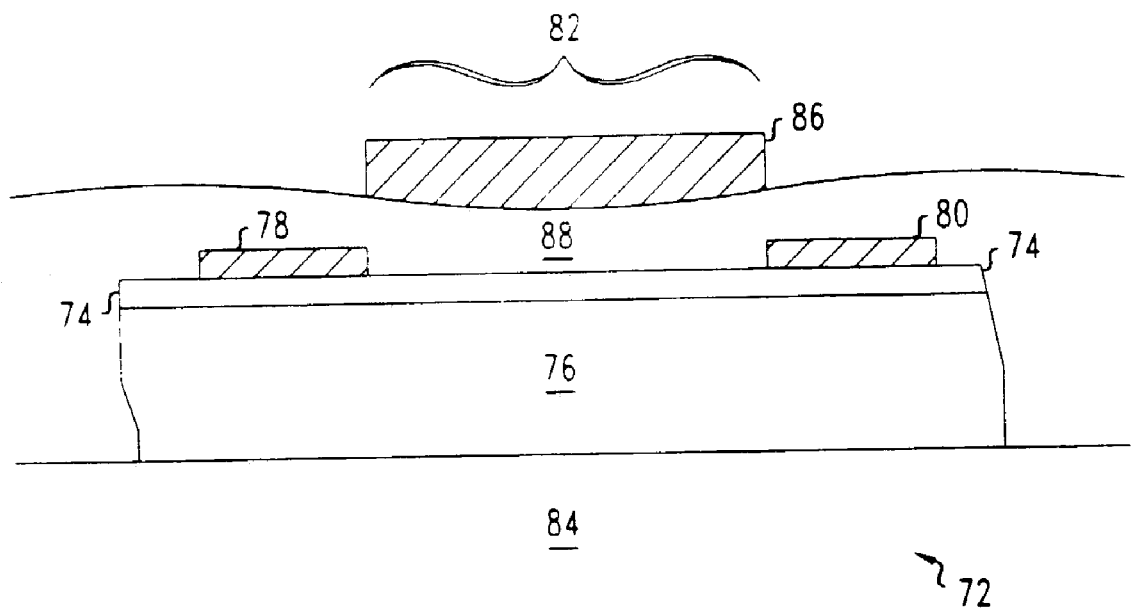
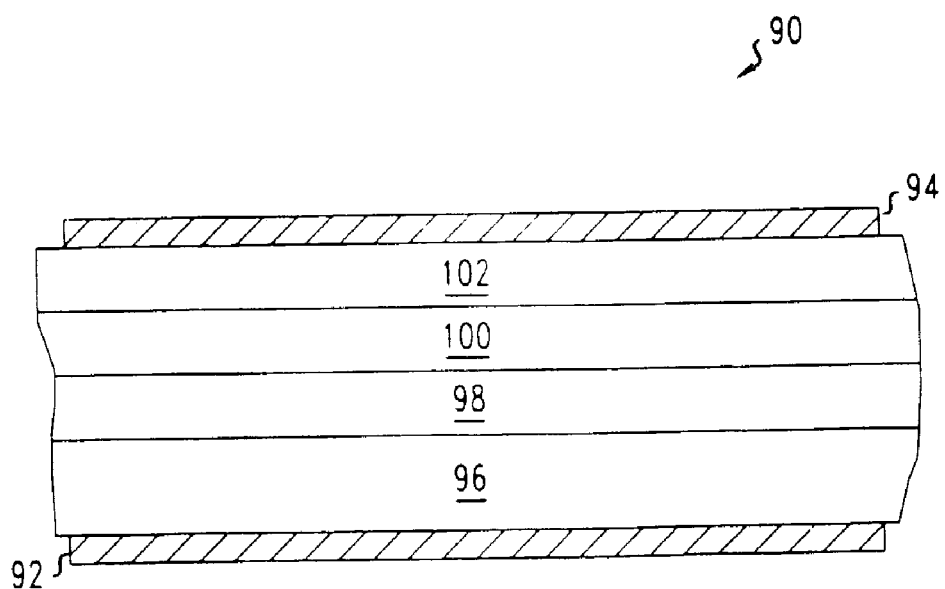

LAYERS OF GROUP III-NITRIDE SEMICONDUCTOR MADE BY PROCESSES WITH MULTI-STEP EPITAXIAL GROWTHS

This is a divisional of Application Ser. No. 10/179,806 filed on Jun. 25, 2002.

BACKGROUND

1. Field of the Invention

The invention relates generally to group III-nitride semiconductors and to methods for fabricating layers of such semiconductors.

2. Discussion of the Related Art

A variety of electronic devices use layers of group III-nitride semiconductors. Herein, group III-nitride semiconductors refer to semiconductors having lattices with primitive cells that include nitrogen and one ore more group III metals. Exemplary of such semiconductors are gallium-nitride (GaN) or aluminum-gallium-nitride (AlGaN).

The manufacture of a layer of group III-nitride semiconductor involves epitaxial growth on a crystalline substrate. In epitaxial growth, the crystalline substrate's lattice controls the initial placement of atoms in the growing layer. Since available crystalline substrates do not have lattices that closely match the lattice of either GaN or AlGaN, epitaxial growth of layers of these group III-semiconductors is presently performed on crystalline substrates with non-matching lattice constants.

FIG. 1 shows a GaN layer 10 that was epitaxially grown on a crystalline substrate 12 with non-matching lattice constants. The mismatch between the lattice constants of the substrate 12 and GaN caused production of lattice defects 14, 15 in the portion 13 of the GaN layer 10 that initially grew on the substrate 12. Some of these initial lattice defects 14 subsequently grew through the entire GaN layer 10. Herein, lattice defects 14 that grow through an entire layer of sequence of layers are known as threading defects.

Threading defects are undesirable in electronic devices, because such defects interfere with carrier transport vertically through and laterally across a layer. In particular, a threading defect often has a higher conductivity than bulk semiconductor and thus, carries more current through a layer than defect-free semiconductor surrounding such a defect. For this reason, a high density of threading defects will partially short out a semiconductor layer so that the conductivity across the layer differs significantly from the conductivity of a bulk semiconductor.

Since densities of threading defects are higher in layers grown on lattice mismatched crystalline substrates, the negative effects of such defects are more severe in such layers. It is thus, desirable to make layers of group III-nitride semiconductors in which conduction properties are less affected by threading defects.

SUMMARY

In a first aspect, the invention features a method for growing a layer of group III-nitride semiconductor in which the density of threading defects is lower than in conventionally grown semiconductor layers of similar composition. The method includes performing an epitaxial growth of a first layer of group III-nitride semiconductor under growth conditions that cause the growth surface to be rough. The rough growth surface increases the rate at which defects annihilate in pairs during the epitaxial growth and thereby lowers the density of defects that grow through the entire layer to become threading defects. The method also includes performing an epitaxial growth of a second layer of group III-nitride semiconductor on the first layer under growth conditions that cause the growth surface to become smooth. Thus, the two-step growth method produces a layer of group III-nitride semiconductor with both a low density of threading defects and a smooth top surface.

In this first aspect, some embodiments provide a specific method for fabricating devices with a layer of a group III-nitride semiconductor that includes gallium. The method includes epitaxially growing a first layer of the semiconductor under gallium-lean growth conditions. The method also includes epitaxially growing a second layer of the semiconductor on the first layer under gallium-rich growth conditions. During the gallium-rich growth, the flow of gallium in an epitaxy gas mixture is greater by, at least, 20 percent than the flow of gallium in the epitaxy gas mixture during the gallium-lean growth.

BRIEF DESCRIPTION OF THE DRAWINGS

FIGS. 6a and 6b are cross-sectional views of respective horizontal and vertical electronic devices made by methods of FIGS. 3 and 5;

DETAILED DESCRIPTION OF ILLUSTRATIVE EMBODIMENTS

Various embodiments of the inventive methods produce improved crystalline layers of group III-nitride semiconductors. Exemplary compositions for the group III-nitride semiconductors include: nitrides of aluminum (Al), gallium (Ga), or indium nitride (In), and alloys of these group III-metal nitride semiconductors, e.g., nitrides of both Al and Ga, of both In and Ga, or of both Al and In. For crystalline layers of semiconductors having these compositions, lattice-matched crystalline substrates for initiating epitaxial growth are unavailable. Epitaxial growth on a non-lattice-matched crystalline substrate creates a high initial density of lattice defects in the portion of the layer located near the initial growth interface with the substrate. In group III-nitride semiconductor layers grown by conventional epitaxy, a large percentage of these initial lattice defects grow through the entire layer to produce threading defects.

The high conductivities and densities of threading defects in conventionally grown layers of group III-nitride semiconductor causes these defects to carry a large portion of any current that flows through such layers. This defect-induced current flow interferes with operation of the layers as bulk semiconductor structures by partially electrically shorting out such current flows. Such defect-induced layer shorting is detrimental during operation of electronic and electro-optical devices based on these semiconductors.

Various embodiments produce improved group III-nitride semiconductor layers with the above-listed semiconductor lattice compositions. The improved layers have lower densities of current-carrying defects than conventionally grown group III-nitride semiconductor layers of similar lattice composition. The densities of such current-carrying defects are lower either because epitaxial growth was performed under conditions that favor annihilation of pairs of defects or because a portion of the threading defects have been electrically passivated.

A. Growth that Favors Annihilation of Pairs of Defects

Figure 1:
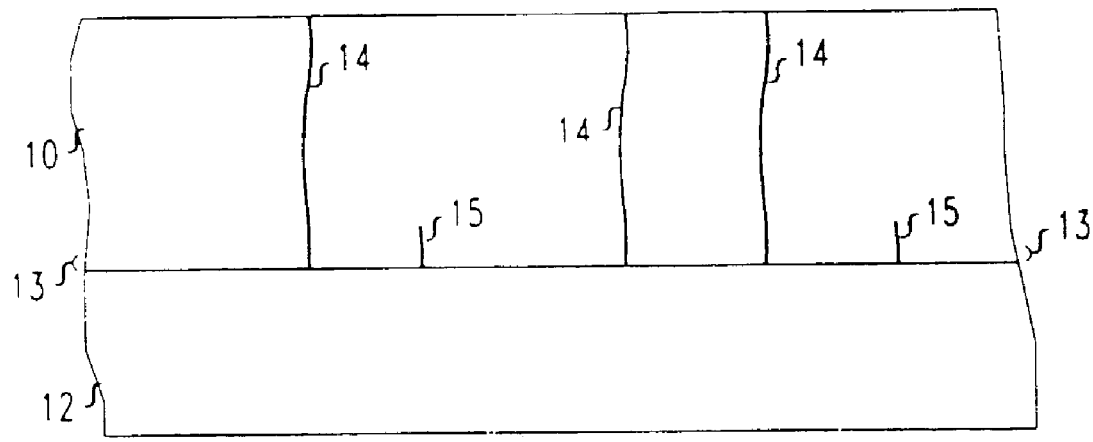
FIG. 1 is a cross-sectional view of a layer of group III-nitride semiconductor grown by conventional epitaxy on a non-lattice-matched crystalline substrate.
Figure 2:
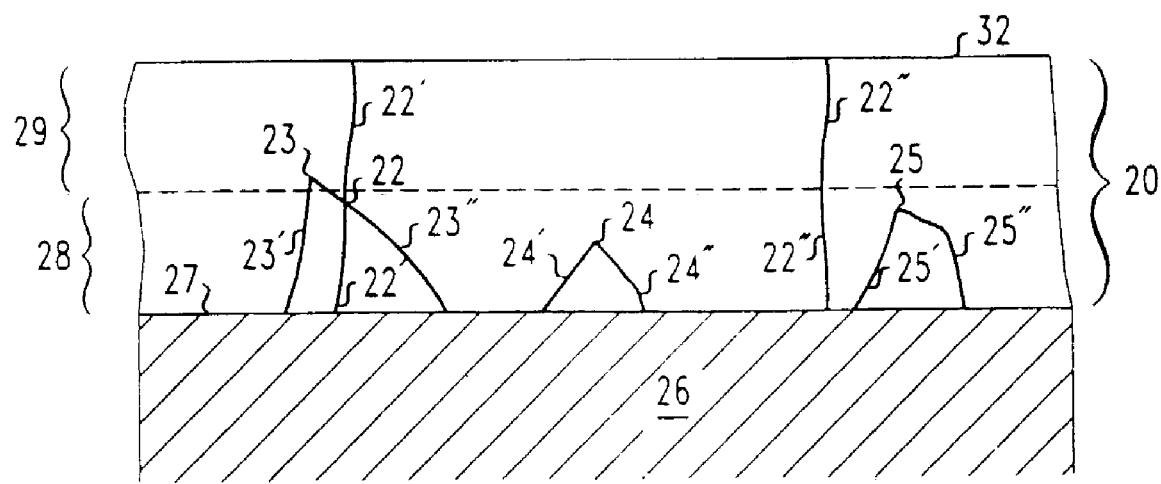
FIG. 2 is a cross-sectional view of a structure with an epitaxially grown layer of group III-nitride semiconductor in which the density of threading defects is lower than in conventionally grown layers of similar composition.

FIG. 2 shows a structure 18 that includes a layer 20 of group III-nitride semiconductor. The layer 20 has a lower density of threading lattice defects 22', 22" than conventionally grown semiconductor layers of similar composition. The layer 20 of group III-nitride semiconductor was epitaxially grown on a crystalline substrate 26 with non-matching lattice constants. Due to the non-matching lattice constants, the layer 20 has a large density of defects 22', 22", 23', 23", 24', 24", 25', 25" near the initial growth interface 27 with the crystalline growth substrate 26.

The layer 20 of group III-nitride semiconductor includes a first layer 28, which is located adjacent the substrate 26, and a second layer 29, which is located on the first layer 28. The second layer 29 has a free top surface 32. The first and second layers 28, 29 have substantially the same composition, e.g., one of the above-listed group III-nitride semiconductor lattice-compositions. The first and second layers 28, 29 result from epitaxial growth phases with different growth conditions.

The first layer 28 includes internal points 22, 23, 24, 25 where pairs of defects (22, 23"), (23', 23"), (24', 24"), (25', 25") meet and combine. These meetings annihilate both defects of a pair when the defects have opposite Burger's vectors. Such defect-pair annihilations occur at the internal points 23, 24, 25. Annihilations of defects during growth cause the defect density to be much lower near the interface 34 between the first and second layers 28, 29 than near the initial growth surface 27 of the first layer 28.

The second layer 29 has a smooth top surface 32 and also has many fewer points per unit thickness where defect pairs meet than the first layer 28. The fewer number of points where defect pairs meet implies that defects annihilate less frequently per unit thickness in second layer 29. For this reason, the defect density decreases more slowly with layer thickness in the second layer 29 than in the first layer 28. The different amount of defect annihilation in the first and second layers 28, 29 results largely from epitaxial growth under different conditions.

Figure 3:
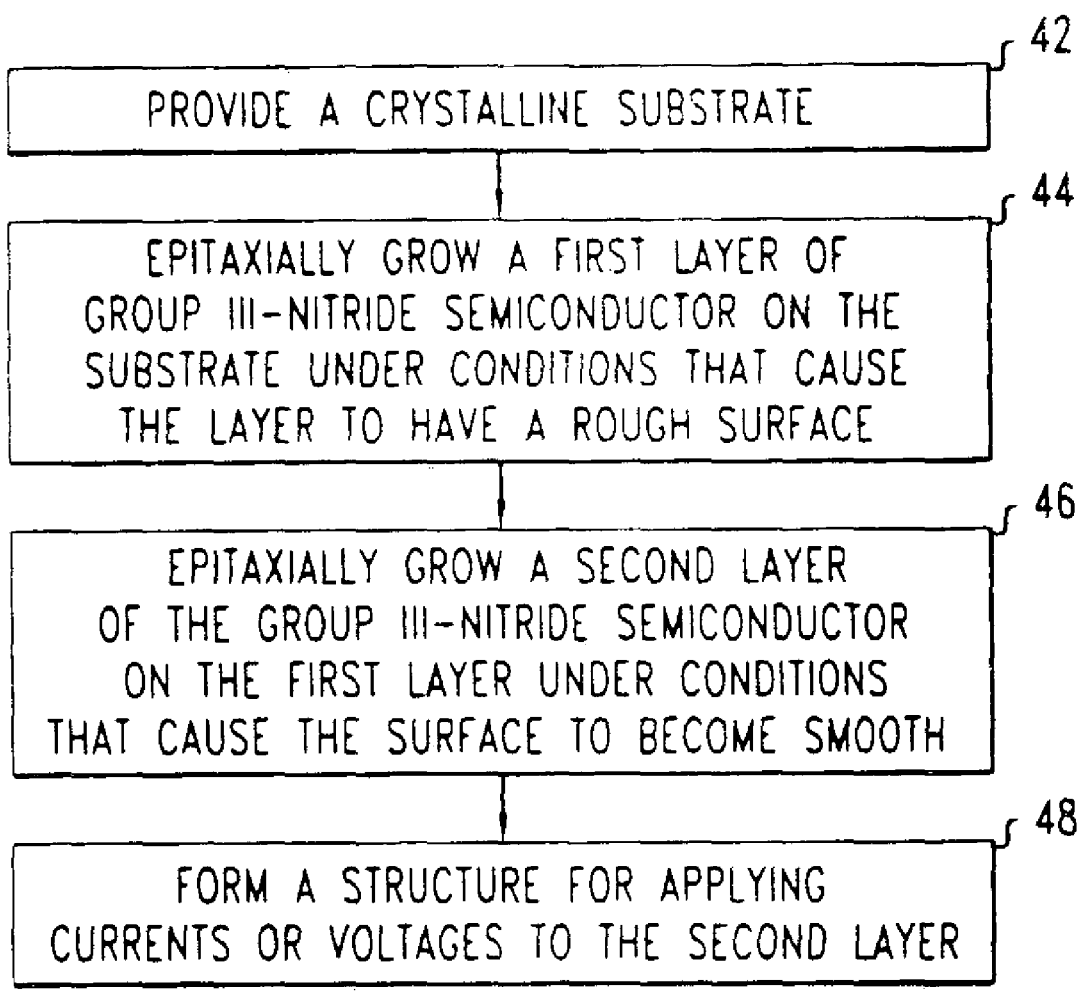
FIG. 3 is a flow chart for a method of fabricating the structure of FIG. 2.

FIG. 3 is a flow chart illustrating one method 40 for growing the layer 20 of group III-nitride semiconductor shown in FIG. 2. The method 40 includes providing a crystalline substrate 26 with a surface for initiating epitaxial growth (step 42). The initial growth surface is smooth on atomic scales and preferably is aligned along lattice directions of the crystalline substrate 26, i.e., a non-vicinal surface. The method 40 includes two epitaxial growth phases.

In the first phase, the method 40 includes performing an epitaxial growth of the first layer 28 of group III-nitride semiconductor on the crystalline substrate 26 under growth conditions that cause the top growth surface of the layer 28 to be rough (step 44). Since the group III-nitride semiconductor and substrate 26 have non-matching lattice constants, the growth produces a high initial density of lattice defects in the first layer 28.

During the epitaxial growth, the initial defect density continually decreases due to defect-pair annihilations. The rate of decrease in the defect density depends on the epitaxial growth energetics. The growth energetics cause defects to preferentially grow towards the basins of valleys on a growing surface. Due to this preferential growth, ends of defects spend more time in such basins on a rough growing surface, which has steeper valleys, than on a smooth growing surface. For that reason, conditions that produce rough growing surfaces also concentrate growing ends of defects such basins. This spatial concentrating of growing ends of defects increases meeting rates of defect pairs, because basins of valleys typically form a small portion of the total area of a growth surface. In turn, the increased meeting rates of defect pairs increases the rate of defect-pair annihilation. Thus, growth conditions that produce a layer with a rough growth surface also produce more rapid reductions of initial defect densities than growth conditions that produce a smooth growth surface.

For GaN, InGaN, and AlGaN layers, a lean stoichiometric ratio of Ga to N in epitaxy gas mixture produces a rough growth surface. If the stoichiometric ratio of Ga to N in the epitaxy gas mixture is between about 0.9 and about 1.0, the top growth surface of the layer 28 of group III-nitride semiconductor will typically be rough.

In the second growth phase, the method 40 includes performing an epitaxial growth of the same group III-nitride semiconductor layer under conditions that cause the growth surface of the layer to become smooth (step 46). This second growth phase continues, at least, long enough to smooth out the roughness produced during the first growth phase of step 44. The second growth phase produces much lower defect annihilation rates than the first growth phase, e.g., rates are one or more orders of magnitude lower, because the energetics of smooth growth surfaces do not cause as much concentration of the growing ends of defects in basins on the growth surface. Thus smooth growth surfaces do not generate the high rates for defect-pair annihilation that exist for rough growth surfaces.

For GaN, InGaN, and AlGaN, a Ga-rich epitaxy gas mixture causes the growth surface to become smooth. Increasing the Ga flow rate in the epitaxy gas mixture by 20 percent or more over the Ga flow rate during step 44 and preferably by 40% or more typically causes the growth surface to become smooth. During the second growth phase, i.e., step 46, the flow of Ga in the epitaxy gas mixture may be increased until concentration of Ga causes the formation of Ga droplets on the growth surface.

The method 40 also includes forming a structure 16 capable of applying a current through or voltage across the completed layer of group III-nitride semiconductor (step 48). In vertical devices, the structure 16 includes a metal layer or one or more doped and/or undoped semiconductor layers, i.e., layers capable of supplying a current to the layer 20. In horizontal devices, the structure 16 includes another semiconductor layer and/or a gate structure for applying a bias voltage across the completed layer 20. Those of skill in the art know how to fabricate such structures.

The method 40 produces a device in which the layer 20 of group III-nitride semiconductor has both a smooth top surface 32 and a low density of threading lattice defects. Preferably, the defect density per unit area adjacent free surface 32 is lower by a factor of 10, 100, or more than the defect density at the initial growth surface 27.

Figure 4A:
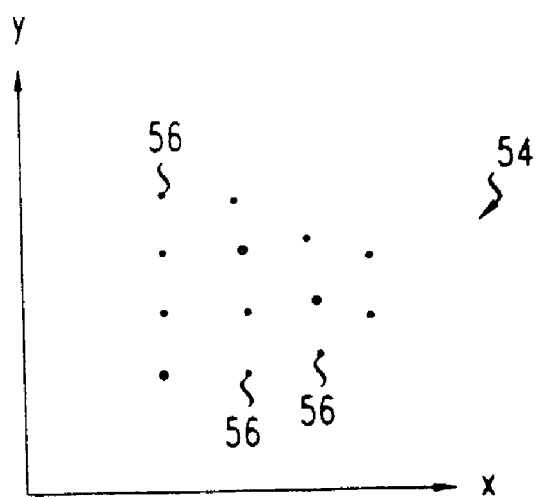
FIGS. 4a and 4b are exemplary diffraction intensity images produced by reflection high-energy electron diffraction (RHEED) off respective rough and smooth surfaces.
Figure 4B:
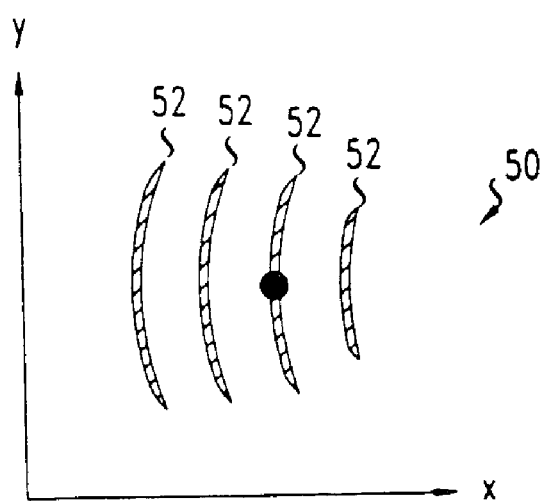

Referring to FIGS. 4a and 4b, reflection high-energy electron diffraction (RHEED) provides an independent method for determining whether surface growth is rough or smooth in steps 44 and 46. In RHEED, a collimated beam of high-energy electrons, e.g., 1–20 Kev electrons, impinges a surface at a grazing angle, e.g., 1° or less. The surface reflects and diffracts electrons of the beam to produce an electron intensity image in a detector. If the surface is rough, the RHEED intensity image has the qualitative form shown by pattern 54 of FIG. 4a. The pattern 54 is a collection of intensity spots 56. If the surface is smooth, the RHEED intensity image has the qualitatively different form of pattern 50 of FIG. 4b. The pattern 50 includes a sequence of high-intensity lines 52, which are produced by long-range height correlations on the smooth surface.

For rough surfaces, the spots in the RHEED image may or may not have a periodic arrangement similar to that of the lines of the RHEED image of a smooth surface. Nevertheless, the spot-like and line-like RHEED images of rough and smooth surfaces are recognizably different by those of skill in the art. A change in a surface's RHEED image between a line-like and spot-like image is indicative of a change between the surface being smooth and the surface being rough.

Figure 5:
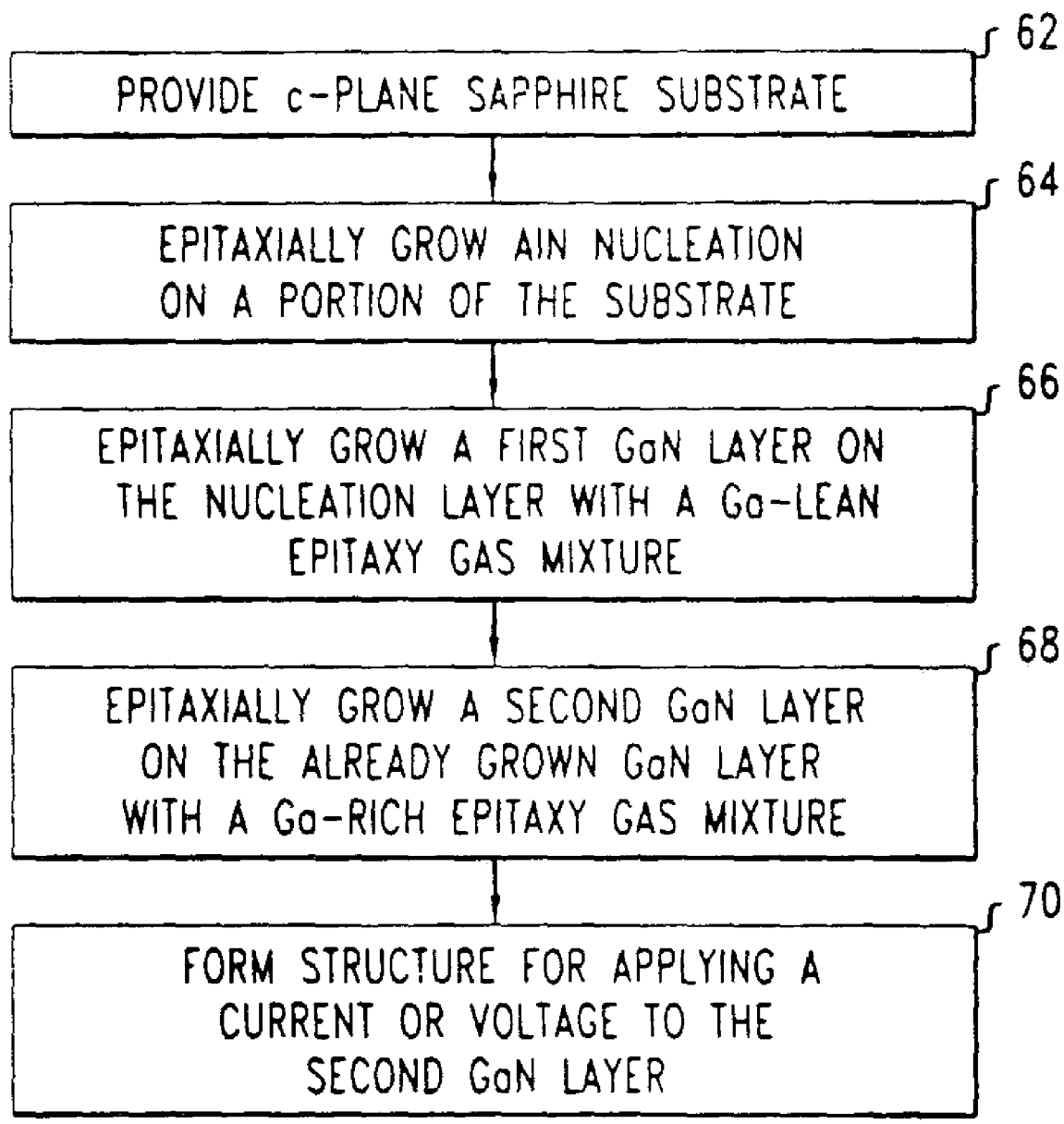
FIG. 5 is a flow chart for a specific method of making a device with a GaN layer having a low density of threading defects.

FIG. 5 shows a specific embodiment 60 for making devices with a layer of GaN according to method 40 of FIG. 3. The method 60 includes providing a sapphire substrate with a c-plane growth surface, i.e., a smooth surface normal to the (0001) lattice direction (step 62). Sapphire substrates with c-plane growth surfaces having low miscut angles, i.e., non-vicinal surfaces, are available commercially.

The method 60 includes performing a plasma molecular beam epitaxy (PMBE) growth of an AlN nucleation layer on the c-plane growth surface (step 64). An appropriate tool for performing the PMBE growth is the Modified Riber 2300 tool that is manufactured by Riber Corp., of Rueil-Malmaison, France (tel: 33 1 47 08 84 91, internet: www.Riber.com). Operating parameters for performing the PMBE growth with the Modified Riber 2300 tool, are: about 0.5 sccm $N_2$, 200 watts (W) forward radio frequency (RF) power, substrate temperature in a range of 650° C. to 800° C. and preferably about 750° C., and epitaxy gas mixture slightly rich in atoms of Al for production of a AlN layer. Exemplary epitaxy gas mixtures for the PMBE growth have ratios of atoms of Al to atoms of N in a range of about 1.00 to about 1.15.

At step 62, the PMBE growth produces an AlN nucleation layer whose thickness is sufficient to completely cover the surface of the sapphire substrate. For c-plane sapphire, a thickness in a range of 15 nanometers (nm) to 100 nm and preferably of about 30 nm suffices to produce complete coverage. Due to the lattice-mismatch between sapphire and AlN, the PMBE grown AlN nucleation layer will have a high defect density. Exemplary AlN layers, which are grown on c-plane sapphire, have about $10^9$–$10^{10}$ defects per centimeter squared ($cm^2$). Such a defect density is much higher than typical densities of about $10^4$ defects per $cm^2$ for layers of GaAs epitaxially grown on lattice-matched crystalline substrates. A thicker AlN nucleation layer may beneficially to further reduce the defect density by defect-pair annihilation.

The method 60 includes using the same PMBE tool to epitaxially grow a first GaN layer, i.e., layer 28 of FIG. 2, on the AlN nucleation layer under Ga-lean growth conditions (step 66). This first GaN growth phase proceeds at the same temperature, power, and $N_2$ flow used for the growth of the AlN nucleation layer. The Ga-lean epitaxy gas mixture has an atomic ratio of Ga to N in the range of about 0.9 to about 1.0. The Ga-lean growth produces a GaN layer with a final thickness of about 300 nm–1500 nm and preferably a final thickness of about 750 nm. During this first GaN growth phase, the GaN layer has a rough growth surface, which produces a spot-like RHEED image.

The method 60 includes using the same PMBE tool to epitaxially grow a second GaN layer, i.e., layer 29 of FIG. 2, on the first GaN layer under Ga-rich growth conditions (step 68). This second GaN growth proceeds with the same operating parameters as the first GaN growth except for the Ga flow rate in the epitaxy gas mixture. In the second GaN growth, the Ga flow rate is higher by, at least, 20%–50%, preferably by about 35%–50%, and more preferably by about 40% with respect to the Ga flow rate during the first GaN growth. The increase in the Ga flow rate causes the growing surface of the GaN layer to become smoother as the second GaN growth phase progresses. The second GaN growth produces a final GaN layer with a smooth top surface, i.e., surface 32 of FIG. 2. Typical total thicknesses for the second GaN layer are in the range of about 1 to 5 microns, but other thicknesses are possible.

The method 60 also includes forming a structure for applying either a current to or voltage across the thickness of the previously formed GaN layer 20 (step 70). Exemplary acts of forming the structure include depositions and/or epitaxial growths of conducting, semiconducting, and/or dielectric layers. The composition of the structure depends on the particular device. The fabrication of the various layers may also include etching processes that define device features, e.g., in the layer 20 of FIG. 2.

FIG. 6a shows a horizontal device 72 fabricated by method 60 of FIG. 5. The device 72 is a field-effect-transistor (FET). The FET includes an $Al_xGa_{1-x}N$ layer 74, a GaN channel layer 76, a source electrode 78, a drain electrode 80, a gate structure 82, and a sapphire epitaxial growth substrate 84. The $Al_xGa_{1-x}N$ layer 74 has a thickness of about 25 nm and an "x" value in the range of about 0.15 to about 0.35. The gate structure 82 includes a metal electrode 86 and, in some embodiments, includes a gate dielectric 88. The $Al_xGa_{1-x}N$ layer 74, gate structure 82, and GaN channel 76 were formed during respective steps 70, 70, and 64–68 of the method 60.

In the device 72, the gate structure 82 controls trapping of a 2-dimensional electron gas (2DEG) in the $Al_xGa_{1-x}N$ layer 74. The $Al_xGa_{1-x}N$ layer 74 has a low defect density, because the $Al_xGa_{1-x}N$ layer 74 was epitaxially grown on the GaN channel layer 76, which also has a low density of threading defects. The low defect density improves the device's ability to produce a 2DEG in the $Al_xGa_{1-x}N$ layer 74, because the low defect density lowers the number of carrier-scattering centers arising from the presence of defects. The low defect density also reduces current-leakage through the AlGaN layer 74 in embodiments in which gate structure 82 does not include a gate dielectric 88.

FIG. 6b shows a vertical device 90 that was fabricated by method 40 of FIG. 3. The device 90 includes lower and upper conducting contacts 92, 94 (e.g., metal contacts); a sapphire growth substrate 96; and epitaxially grown layers of group III-nitride semiconductors 98, 100, and 102.

In the various embodiments, the vertical device 90 requires current transport through the layers 98–102 during operation. In the vertical device 90, the two-phase growth process of FIG. 3 grows one, two, or all three of the layers 98–102, i.e., any or all of the layers 98, 100, or 102. For that reason, the density of defects that threads the three group III-nitride semiconductor layers 98–102 is low. The low density of threading defects enables the layers 98–102 to function as a better bulk semiconductor layers than would otherwise be possible if all of the layers 98, 100, 102 were grown by conventional epitaxy techniques. In the device 90, threading defects do not significantly short out current flows between electrical contacts 92 and 104.

In some embodiments, the group III-nitride semiconductor layers 98, 100, 102 are doped to function as collector, base, and emitter of a bipolar transistor. The dopant densities and types may be varied in various ones of the layers 98, 100, 102 to produce the different device functions, e.g., collector, base, or emitter, and/or different transistor conductivity-types, i.e., n-type or p-type.

In other embodiments, the layers 98, 100, 102 have respective compositions AlGaN, GaN, and AlGaN and function as a quantum well, which emits light spontaneously or by optically stimulated processes in response to current pumping. In such quantum wells, the layers 98, 100, 102 are typically doped separately.

B. Electrical Passivation of Threading Defects

Figure 7:
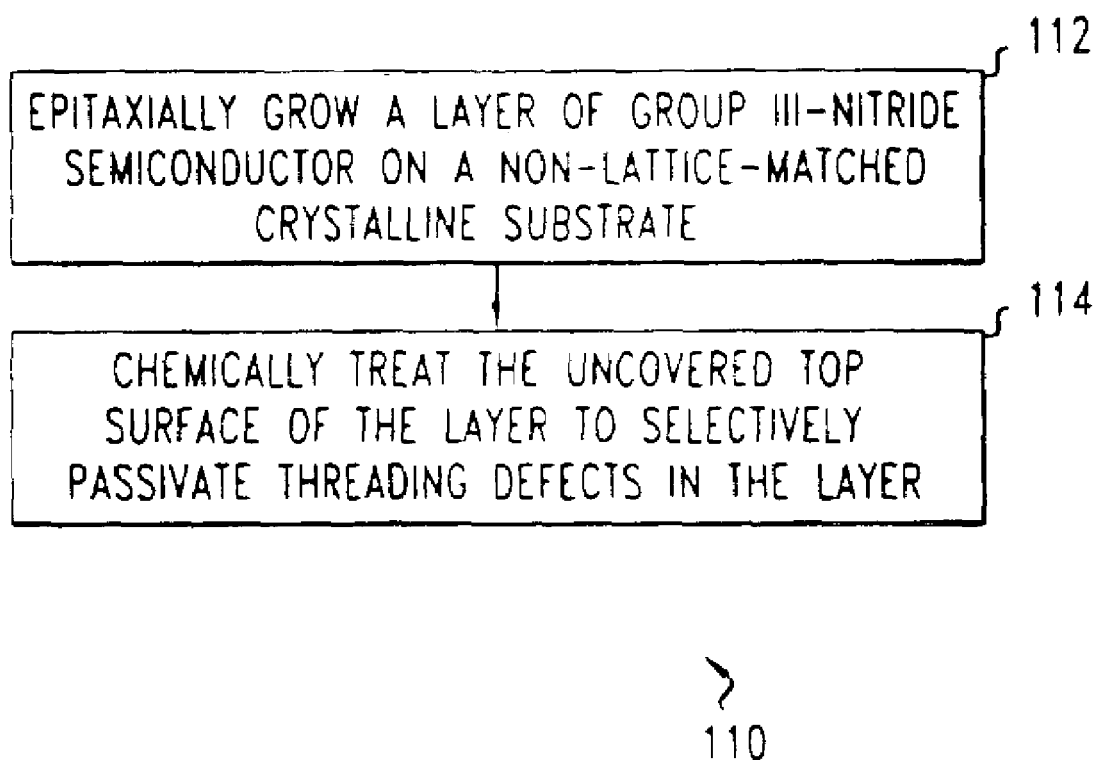
FIG. 7 is a flow chart for a method of fabricating a device with a layer of group III-nitride semiconductor having passivated threading defects.

FIG. 7 illustrates a method 110 for fabricating vertical electronic devices with electrically passivated threading defects. Electrically passivated defects do not conduct DC currents more than the surrounding semiconductor matrix. The vertical electronic devices include one or more layers of group III-nitride semiconductor. The group III-nitride semiconductors have a composition selected from the group: Ga and N, Al and N, In and N, and alloys of: GaN, AlN, and/or InN. The method 110 produces intermediate structures 120, 130 of FIGS. 8–9.

Figure 8:
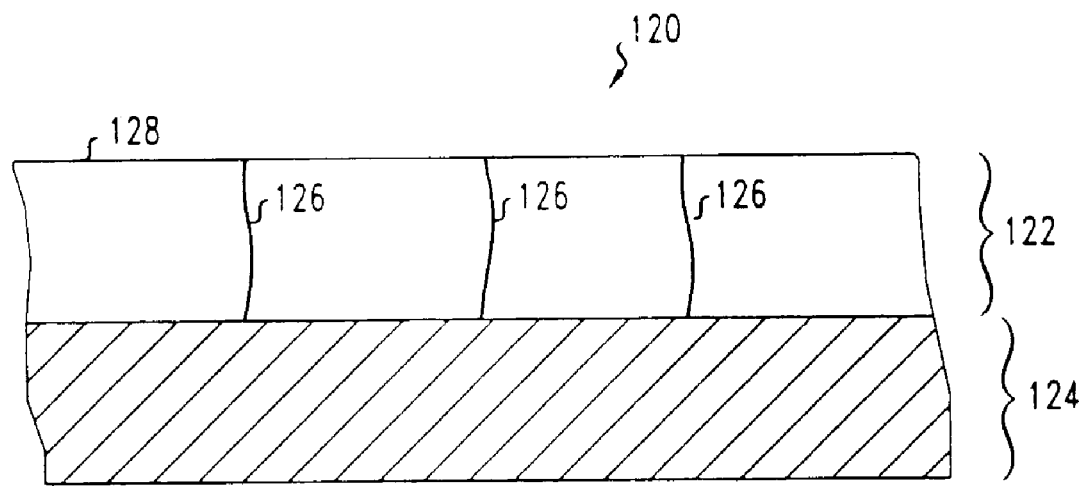
FIGS. 8–9 are cross-sectional views of intermediate structures produced by the method of FIG. 7.

The method 110 includes epitaxially growing a layer 122 of group III-nitride semiconductor on a lattice-mismatched crystalline substrate 124 to produce structure 120 of FIG. 8 (step 112). The epitaxial growth produces a high initial density of lattice defects 126 due to the different lattice constants for the crystalline substrate 124 and the group III-nitride semiconductor of the layer 122. The epitaxial growth also produces a smooth top surface 128 on the layer 122 of group III-nitride semiconductor.

Preferably, the epitaxial growth of step 112 proceeds in a "metal-rich" epitaxy gas mixture. In the metal-rich gas mixture, the atomic concentration of metal atoms, e.g., Ga, In, and/or Al, is greater than the atomic concentration of nitrogen atoms. The metal-rich gas mixture produces a smooth top surface 128 and also causes the concentration of metal atoms to be higher near and inside defects 126 than in the surrounding group III-nitride semiconductor matrix.

In the step 112, the epitaxial growth may or may not produce a high density of threading defects 126. In some embodiments, the step 112 involves a two-phase growth according to steps 42 and 44 of FIG. 3. In these embodiments, the step 112 produces a relatively lower density of threading defects 126 due to the increased rate of defect-pair annihilation during one growth phase of the layer 122. In other embodiments, step 112 involves a conventional one-step epitaxial growth, which produces a relatively higher density of threading defects 126 in the layer 122.

Figure 9:
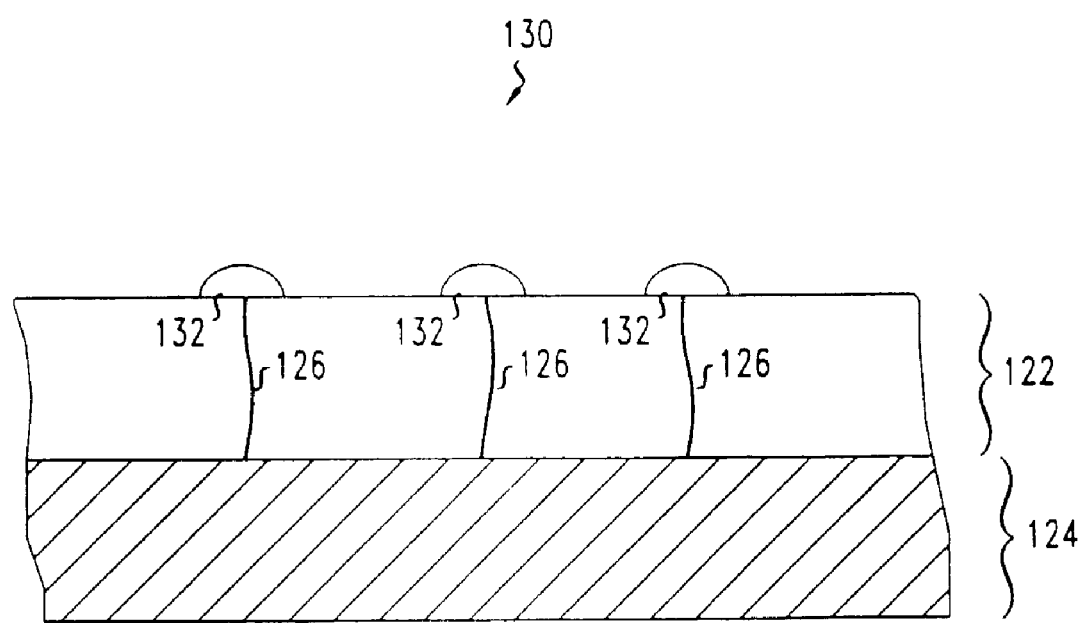

The method 110 includes chemically treating top surface 128, i.e., the uncovered surface of the layer 122, by a process that selectively produces electrical passivation of threading defects 126 in the group III-nitride semiconductor layer 122 (step 114). The selective passivation produces insulating caps 132 over ends of threading defects 126 as shown in FIG. 9. The selective passivation covers the ends of threading defects 126 and nearby areas with insulating dielectric without covering or altering properties of portions of the semiconductor surface 128 that are distant from such lattice defects 126.

The insulating caps 132 comprise a metal oxide that may be produced by reacting excess metal from the region inside and/or near threading defects 126 with an ambient oxidizer.

After passivating the threading defects, a conductive layer may also be formed on the top surface 128 of the layer 122 by a conventional deposition of metal and/or doped or undoped semiconductor. The dielectric caps 132 electrically insulate such a conductive layer from the threading defects 126. For that reason, DC currents will pass from such a conductive layer through the bulk group III-nitride semiconductor of the layer 122 rather than being shorted through the threading defects 126.

Figure 10:
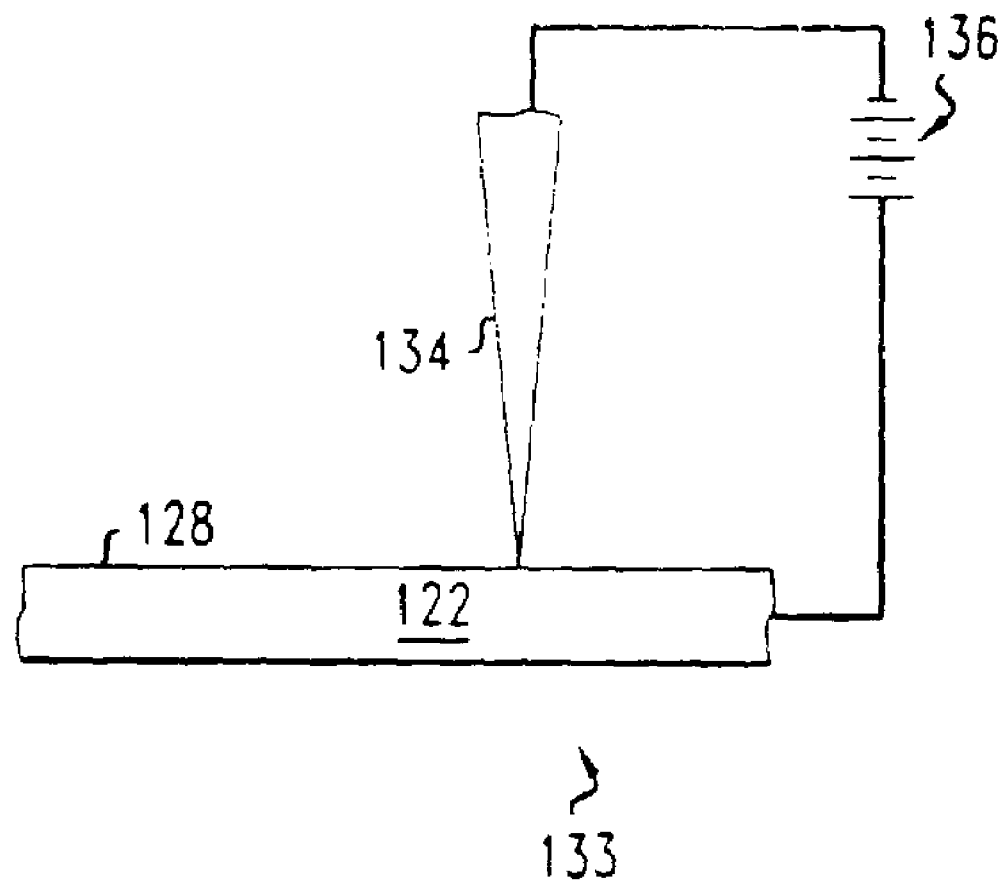
FIG. 10 shows a device used to electro-chemically passivate the threading defects of a semiconductor layer.

FIG. 10 is a schematic cross-sectional view of a setup 133 for performing method 110 of FIG. 7 with an atomic force microscope (AFM). An exemplary AFM is produced by Digital Instruments Inc. of Santa Barbara, Calif. or by TM Microscope of Sunnyvale, Calif. The AFM includes a fine conducting or metallic tip 134. During passivation, the tip 134 is in contact with the top surface 128 of the semiconductor layer 122 and is maintained at a moderate bias voltage by a source 136 so that a current flows between the tip 134 and the surface 128. For passivating GaN layers, some embodiments use a hardened conducting sensor tip manufactured by Nanosensors GmbH & Co. KG of Koogstraat 4, D-25870 Norderfriedrichskoog, Germany for the tip 134. Exemplary hardened conducting sensor tips include a boron doped diamond tip and a platinum-iridium alloy tip.

Figure 11:
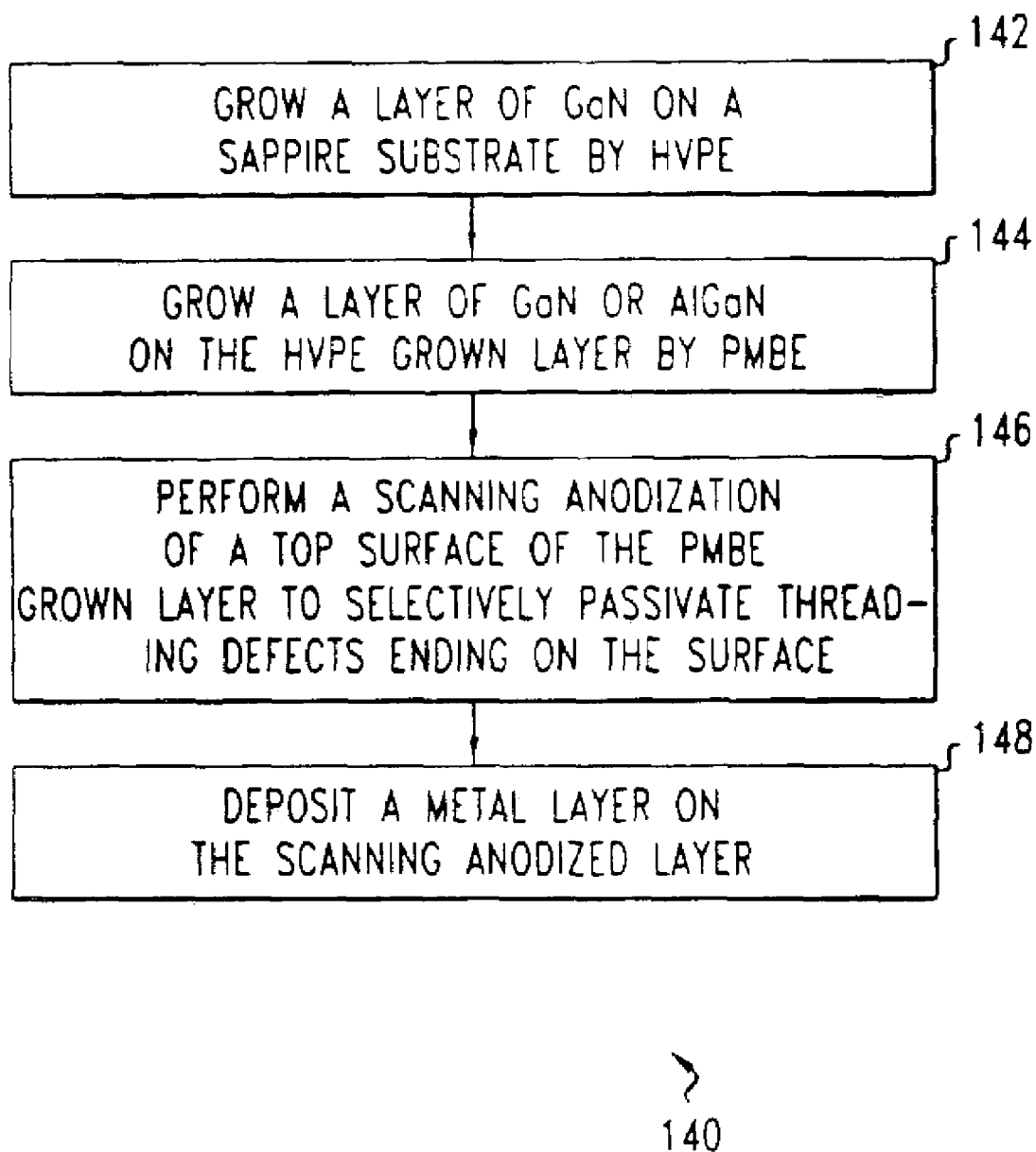
FIG. 11 is a flow chart for a scanning method of making a device in which threading defects in a semiconductor layer have been selectively passivated.

FIG. 11 illustrates a method 140 for using setup 133 of FIG. 10 to produce a vertical electronic device with a passivated GaN or AlGaN layer.

The method 140 includes epitaxially growing a thick layer of GaN on a c-plane crystalline sapphire substrate via hydride vapor phase epitaxy (HVPE) (step 142). HVPE is known to those of skill in the art and is described in U.S. Pat. No. 6,086,673, which is incorporated by reference herein in its entirety. The GaN layer has an exemplary thickness of about 1–20 microns. During the growth of the thick GaN layer, some annihilation of initially produced defects-pairs occurs.

On the HVPE grown GaN layer, method 140 includes performing a PMBE growth of a layer of GaN or AlGaN under Ga-rich growth conditions (step 144). The Ga-rich growth conditions include using an epitaxy gas mixture in which an atomic ratio of Ga to N has a value of 1 or more, preferably has a value of about 1.0 to about 1.3, and more preferably has a value of 1.1 to 1.2. An appropriate tool for the PMBE growth is the Modified Riber 2300 tool that has already been described. Operating parameters for performing the PMBE with the Modified Riber 2300 tool are: about 0.5 sccm N$_2$, 200 watts (W) forward radio frequency (RF) power, substrate temperature in a range of 600° C. to 800° C. and preferably about 750° C. The PMBE layer is grown to a thickness determined by final device requirements. Typical thicknesses of the PMBE layer are between about 300 nm and about 2 microns.

The method 140 includes performing a scanning anodization of a semiconductor surface of the PMBE grown GaN or AlGaN layer in an ambient oxidizer (step 146). The scanning anodization uses the device 133 of FIG. 10. The current causes an electro-chemical reaction between metal atoms near the top surface 128 and the ambient oxidizer. The electrochemical reactions selectively produce insulating caps 132 of metal oxide over ends of threading defects 126. The enhanced metal concentration inside defects 126 causes the electro-chemical reaction to proceed more rapidly near ends of the threading defects 126 than at generic points on the uncovered top surface 128. Thus, the oxide formation and electrical passivation of the top surface 128 is selectively concentrated around the ends of the threading defects 126, e.g., the surface is not completely covered by the oxide.

During the scanning anodization, the GaN or AlGaN layer is exposed to ambient air, and the tip 134 is negatively biased by about −8 to −12 volts with respect to the PMBE grown layer 122. The ambient air is at room temperature, standard pressure, and standard humidity. The scanning anodization involves pressing the conducting tip 134 against the top surface 128 of the GaN or AlGaN layer with a force of the order of $10^{-9}$ newtons and moving the conducting tip 134 over the layer 122 in a line-like scan pattern. The scanning anodization selectively produces oxide over ends of threading defects 126 due to the higher current flows through such defects 126 during the scan.

During the scanning anodization, the conducting sensor tip is moved in a raster pattern over the top semiconductor surface 128 at a speed of about 0.5 to 2.5 microns per second. The lines of the raster pattern are separated by about 20 nm or less to insure that the scan does not miss defects.

Figure 12:
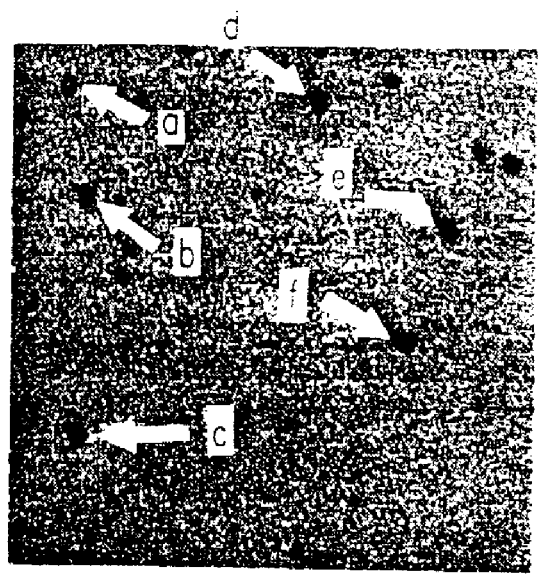
FIGS. 12a and 12b are scanning current-voltage microscopy images of semiconductor layers before and after selective passivation of defects by method of FIG. 11.
Figure 12:
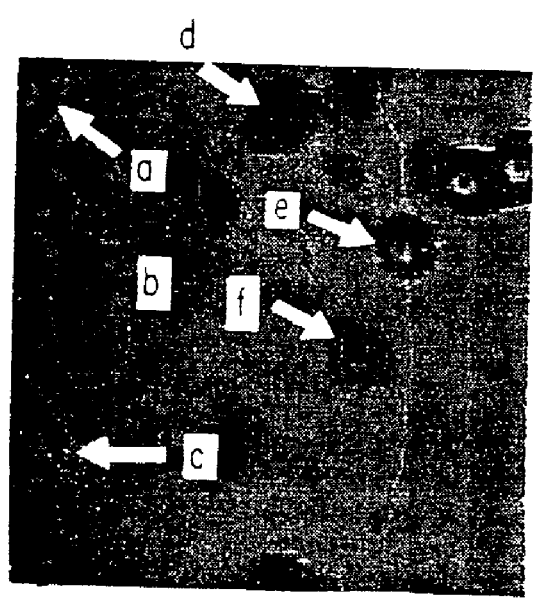

FIGS. 12a and 12b are scanning current-voltage microscopy (SIVM) images 134, 134' of top surface 128 respectively, before and after the scanning anodization in step 146 of FIG. 11, i.e., corresponding to structures 120 and 130 of FIGS. 8 and 9. The images 134, 134' were taken with an atomic force microscope (AFM) and a conducting tip. In the SIVM images 134, 134', regions that conduct a higher current are darker than surrounding areas of the surface. The SIVM image 134 prior to anodization shows that positions a-f of the surface 128 conduct more current than the surrounding GaN semiconductor. The positions "a-f" correspond to the ends of threading defects. The image 134' shows that the scanning anodization affected wide regions around the positions "a-f" of ends of defects. Inside a dark annular ring, a region is passivated and transports no more current than the defect-free semiconductor located farther away from the associated central position a-f. In the SIVM image 134', the wide annular regions are produced by the high bias voltage used to make the SIVM image 134'. Making multiple scans the same region of the surface 128 with the same bias voltage removes these wide annular regions. Thus, the SIVM images 134, 134' show that scanning anodization of the surface 128 produces selective electro-chemical passivation of the threading defects 126 so that the layer 128 functions more like a layer of defect-free semiconductor.

Referring again to FIG. 11, embodiments of the method 140 also include depositing a contact layer, e.g., a metal layer, on the anodized GaN or AlGaN layer to produce an electrical contact for current-driving the final device (step 148). During operation, a driving current does not see a GaN or AlGaN layer that is shorted out by threading defects, because the insulating caps 132 electrically insulate the threading defects 126 from the overlying contact layer.

Figure 13:
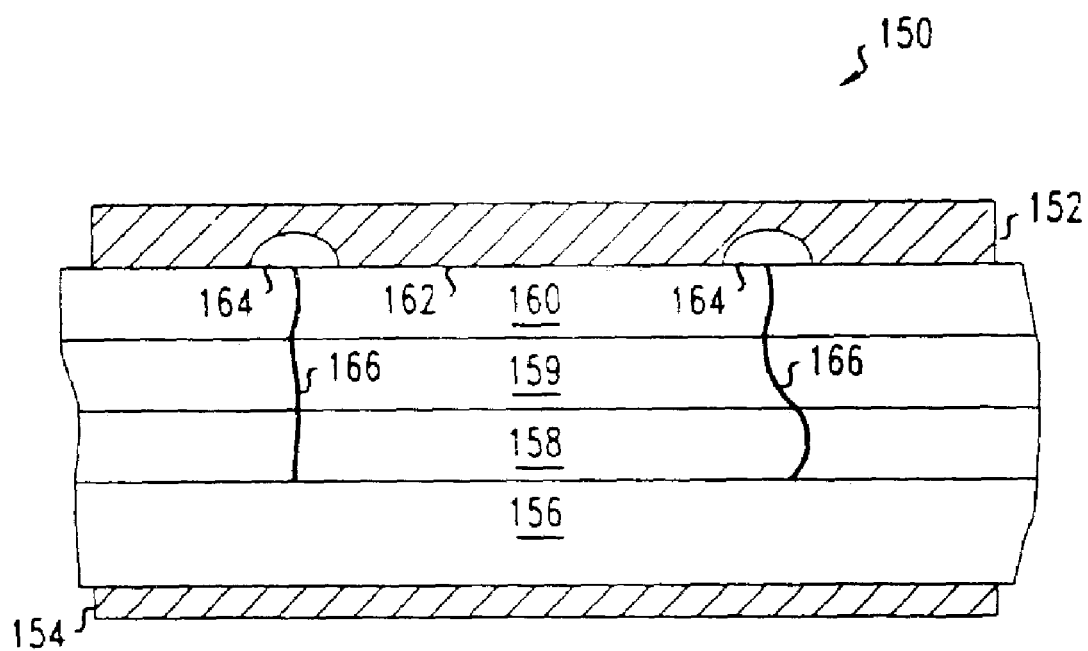
FIG. 13 shows a vertical electronic device that was fabricated according to method of FIG. 11.

FIG. 13 shows a portion of a vertical electronic device 150 that was made according to method 140 of FIG. 10. The vertical electronic device 150 includes lower and upper conductive contact layers 152, 154, e.g., metallic layers; a sapphire growth substrate 156 and a stack of epitaxially grown layers 158–160 of group III-nitride semiconductor. The substrate 156 and the layers 158–160 are located between the conductive contact layers 152, 154, which provide a current for driving the vertical electronic device 150.

The uppermost layer 160 of group III-nitride semiconductor has an interface 162 with the upper contact layer 152, i.e., surface 128 of FIGS. 8–9. At the interface 162, oxide caps 164 electrically insulate ends of threading defects 166 from the upper conductive contact layer 152. The oxide caps 166 cause driving currents to flow more through the defect-free regions of the semiconductor layers 158–160 rather than being confined to the threading defects 166.

In some embodiments, the group III-nitride semiconductor layers 158–160 are NPN or PNP doped so that the vertical electronic device 150 functions as a bipolar transistor. In the bipolar transistor, layers 158, 159, and 160 are doped differently to form the collector, base, and emitter of the transistor.

In other embodiments, the layers 158–160 have respective semiconductor compositions AlGaN, GaN, and AlGaN and form a quantum well structure. The layers 158–160 may have different dopant levels and have different dopant types, i.e., n-type or p-type, in the quantum well structure. The quantum well structure emits light spontaneously or by optically stimulated emission in response to current pumping through the upper and lower conductive contact layers 152, 154.

From the disclosure, drawings, and claims, other embodiments of the invention will be apparent to those skilled in the art.

What is claimed is:

1. A method, comprising:
   epitaxially growing a first layer of group III-nitride semiconductor under growth conditions that cause a growth surface to be rough; and
   then, epitaxially growing a second layer of group III-nitride semiconductor on the first layer under growth conditions that cause the growth surface to become smooth; and
   wherein the act of epitaxially growing a first layer includes growing the first layer with an epitaxy gas mixture in which a ratio of atoms of metal to atoms of nitrogen is less than one.

2. The method of claim 1, wherein the group III-nitride semiconductors of the first and second layers are the same group III-nitride semiconductor.

3. The method of claim 1, wherein the act of growing a second layer includes increasing a flow of one type of group III-metal in an epitaxy gas mixture by at least 20 percent with respect to the flow of the same type of group III-metal in the epitaxy gas mixture during the act of growing a first layer.

4. The method of claim 1, wherein the act of growing a second layer includes causing a ratio of atoms of one type of group III-metal to atoms of nitrogen in the epitaxy gas mixture to have a value at least as great as one.

5. The method of claim 1, wherein the first and second layers are capable of producing spot-like and line-like RHEED images, respectively.

6. The method of claim 1, wherein the growing a first layer includes performing epitaxial growth of a group III-nitride semiconductor on a lattice-mismatched crystalline substrate.

7. The method of claim 1, wherein the epitaxially growing a first layer includes growing the first layer on a substrate, the substrate having a temperature in the range of 650° C. to 800° C. during the epitaxially growing a first layer.

8. A method, comprising:
   epitaxially growing a first layer of group III-nitride semiconductor with an epitaxy gas mixture that includes group III-metal atoms and nitrogen, the gas mixture having a value for the ratio of atoms of group III-metal to atoms of nitrogen that is less than one; and
   then, epitaxially growing a second layer of group III-nitride semiconductor on the first layer under growth conditions that include an increased flow of group III-metal atoms in the epitaxy gas mixture by at least 20 percent.

9. The method of claim 8, wherein the group III-nitride semiconductors of the first and second layers include one of indium and aluminum.

10. The method of claim 8, wherein the group III-nitride semiconductors of the first and second layers include gallium.

11. The method of claim 10, wherein the epitaxially growing a first layer includes growing the first layer on a substrate, the substrate having a temperature in the range of 650° C. to 800° C. during the epitaxially growing a first layer.

12. A method, comprising:
   epitaxially growing a first layer of group III-nitride semiconductor with an epitaxy gas mixture that includes group III-metal atoms and nitrogen, the gas mixture having a value for the ratio of atoms of group III-metal to atoms of nitrogen that is less than one;
   then, epitaxially growing a second layer of group III-nitride semiconductor on the first layer under growth conditions that include an increased flow of group III-metal atoms in the epitaxy gas mixture by at least 20 percent;
   epitaxially growing another layer of a group III-nitride semiconductor adjacent the second layer to produce a vertical electronic device, wherein the another layer has a different conductivity type than the first layer; and
   forming a contact layer configured to one of apply a bias voltage across the another layer and drive a current through the layers.

* * * * *